United States Patent
Svensson et al.

(10) Patent No.: US 6,262,612 B1
(45) Date of Patent: Jul. 17, 2001

(54) USING STORAGE ELEMENTS WITH MULTIPLE DELAY VALUES TO REDUCE SUPPLY CURRENT SPIKES IN DIGITAL CIRCUITS

(75) Inventors: Lars Svensson, Göteborg; Alf Jörgen Peter Larsson, Bjarred, both of (SE)

(73) Assignee: Telefonaktiebolaget L M Ericsson, Stockholm (SE)

( * ) Notice: Subject to any disclaimer, the term of this patent is extended or adjusted under 35 U.S.C. 154(b) by 0 days.

(21) Appl. No.: 09/543,401

(22) Filed: Apr. 5, 2000

(51) Int. Cl.[7] .................................................. H03L 7/00
(52) U.S. Cl. .............................. 327/161; 326/33; 327/384
(58) Field of Search .................................. 326/26, 27, 28, 326/33; 327/141, 161, 379, 384

(56) References Cited

U.S. PATENT DOCUMENTS

| 4,696,020 | 9/1987 | Carlach | 377/48 |
| 5,229,657 | 7/1993 | Rackley | 307/443 |
| 5,362,996 | 11/1994 | Yizraeli | 326/27 |
| 5,596,284 | * 1/1997 | Wykes et al. | 326/27 |
| 5,670,899 | 9/1997 | Kohdaka | 326/97 |
| 5,721,545 | 2/1998 | Poplevine | 341/100 |
| 5,764,074 | 6/1998 | Wykes et al. | 326/27 |
| 6,184,729 | * 2/2001 | Pasqualini | 327/112 |

FOREIGN PATENT DOCUMENTS

| 02029146 | 10/1991 | (JP) . |
| 03178634 | 2/1993 | (JP) . |
| 04209991 | 7/1993 | (JP) . |
| 05348273 | 7/1995 | (JP) . |

\* cited by examiner

*Primary Examiner*—Jeffrey Zweizig
(74) *Attorney, Agent, or Firm*—Jenkens & Gilchrist, P.C.

(57) ABSTRACT

Commonly clocked digital storage elements are provided with mutually different clock-to-output delays in order to timewise stagger their respective switching current spikes from one another, thereby "smearing" the aggregate current spike over time.

20 Claims, 4 Drawing Sheets

USING STORAGE ELEMENTS WITH MULTIPLE DELAY VALUES TO REDUCE SUPPLY CURRENT SPIKES IN DIGITAL CIRCUITS

FIELD OF THE INVENTION

The invention relates to digital circuit design and, more particularly, to digital circuit designs that experience supply current spikes during digital state updates.

BACKGROUND OF THE INVENTION

In the design of synchronous digital circuits, clock signals are used to synchronize computations in the digital circuits. The task of the clock signals is to ensure that all storage elements update their values simultaneously. Storage elements, such as latches and flip-flops, are responsive to a transition of a clock signal input to: sample output digital signals of combinational logic; internally preserve the digital values as the state of the circuit; and make the state available for new combinational logic computations after a certain delay has elapsed since the clock signal transition.

A storage element makes its internal digital state available by driving its output signal to a corresponding voltage level. When the new voltage level is higher than the previous one, current is briefly drawn from the voltage supply to charge the signal capacitance. Conversely, current is briefly dumped into the ground network when the new voltage level is lower than the previous one.

Conventional schemes for distributing clock signals to storage elements concentrate on ensuring a high degree of synchronism among all clock signals. Clocks are typically distributed in a tree-like structure, whereby delays in different branches can be balanced to a high degree. One benefit is that the clock rate can be high, because it is not limited by variations in clock arrival times. Even for lower clock rates, uniformity brings predictability and therefore simplifies the overall design problem.

Highly balanced clock distribution networks cause the outputs of all storage elements in the design to toggle virtually simultaneously. The capacitive loads driven by the flip-flop outputs are then charged simultaneously, briefly drawing a large aggregate current spike from the supply. Such current spikes are undesirable for several reasons.

Metal migration in supply wires is a major reliability problem. The rate of migration depends strongly on the maximum current density which occurs in the wire. Large current spikes thus disadvantageously require wider supply wires with the concomitant cost in area.

Large current spikes feature large values of dI/dt. Together with the parasitic inductance present in the IC package, the current spikes thus cause voltage fluctuations on the supply lines. These fluctuations can cause both malfunction of the digital circuits and reduced performance levels in co-located analog circuitry. These problems can be addressed with advanced packaging and on-chip decoupling capacitance, both of which disadvantageously increase cost.

Also, large current spikes can themselves couple inductively into other parts of the design and cause malfunction or performance reduction.

The present invention mitigates supply current spikes caused by simultaneous toggling of storage element output signals. This can be achieved by using storage elements which differ in their respective clock-to-output delays. The delay variation among storage elements is also referred to herein as "delay spread". The delay spread causes the outputs of different storage elements to toggle at slightly different times, such that the individual current spikes of the respective storage elements are slightly staggered (i.e., offset from one another) in time. The delay spread therefore serves to "smear out" the overall (aggregate) current spike over time, advantageously reducing its maximum value as well as the maximum value of dI/dt.

DETAILED DESCRIPTION

Figure 1:
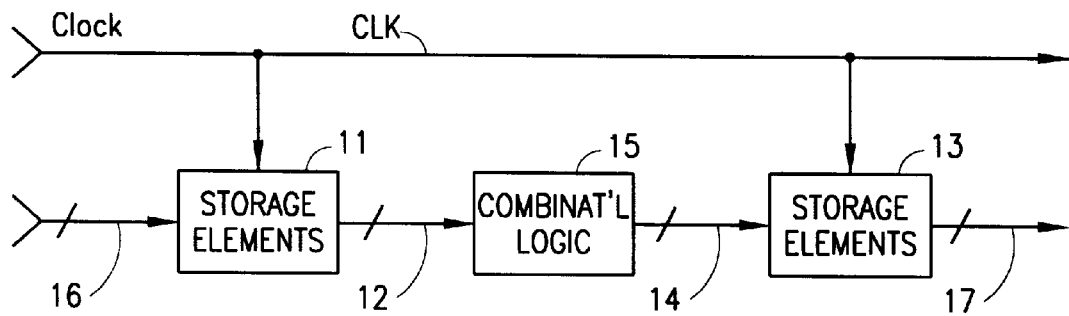
FIG. 1 illustrates an exemplary embodiment of a digital circuit according to the invention.

FIG. 1 illustrates a general example of a synchronous digital circuit in which the present invention can be implemented. A first plurality of storage elements (for example flip-flops, latches, etc.) is designated generally at 11, and a second plurality of storage elements is designated generally at 13. The storage elements illustrated at 11 and 13 receive respective digital signals at their respective data inputs (shown collectively at 16 for the storage elements 11, and shown collectively at 14 for the storage elements 13), and transfer the input digital signals to their respective data outputs (shown collectively at 12 and 17) in response to a clock signal that commonly drives the clock inputs of all of the storage elements at 11 and 13.

The output digital signals at 12 are input to combinational logic 15, and the input digital signals at 14 are provided as outputs from the combinational logic 15. The input digital signals at 16 can be provided as outputs from other combinational logic (not shown), and the output digital signals at 17 can be provided as inputs to still other combinational logic (not shown). In other exemplary arrangements, the digital signals output at 14 from combinational logic 15 could be fed back to the digital inputs 16 of storage elements 11, and the digital signals output at 17 from the storage elements 13 could be fed back and input to the combinational logic 15 instead of the outputs 12 of storage elements 11.

Some or all of the storage elements at 11 can be provided with clock-to-output delays that differ from one another, and/or some or all of the clock-to-output delays of the storage elements at 11 can differ from some or all of the clock-to-output delays of the storage elements at 13. The differences in clock-to-output delays among the various storage elements at 11 and 13 cause the respective outputs of the commonly clocked storage elements to switch (toggle) at different points in time, whereby the current spikes associated with the switching of the individual storage elements are timewise offset from one another, so the aggregate current spike associated with a given clock transition is "smeared" over time.

In the simplified case when the capacitive loads at the outputs of all storage elements are equal, the maximum current spike smearing is achieved when every storage element of FIG. 1 has a delay value that differs from the delay value of every other storage element of FIG. 1. In practice, the number of storage elements in a circuit will in most cases be much larger than the number of available variations of storage elements delay values. Thus, the optimal result will depend on the assignment of the existing storage elements to a small number of existing delay classes.

Figure 6:
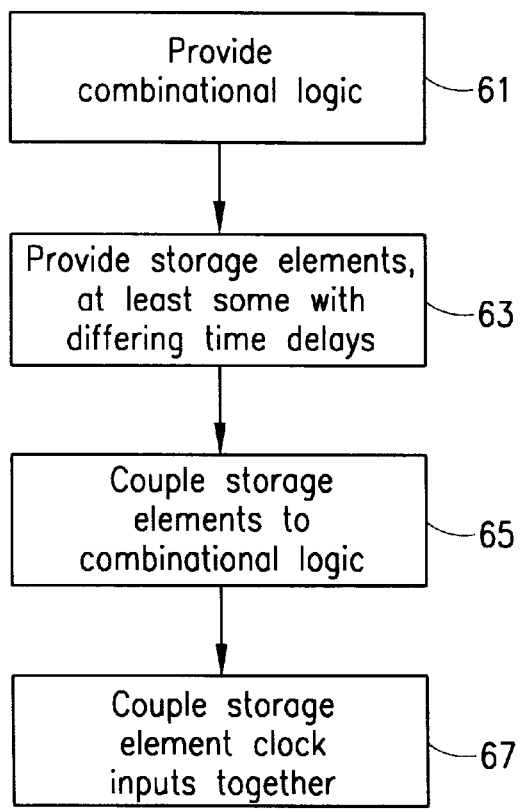
FIG. 6 illustrates an exemplary process for producing a digital circuit such as shown in FIG. 1.

FIG. 6 illustrates an exemplary process for producing the circuit design of FIG. 1. The logic is provided at 61, the storage elements are provided at 63 with some difference in delay values, the storage elements are coupled to the logic at 65, and the storage element clock inputs are coupled together at 67. The example process of FIG. 6 should not be construed as imposing any timewise order of execution on the steps illustrated. These steps can be performed in other exemplary temporal orders, some of which are described below.

Figure 2:
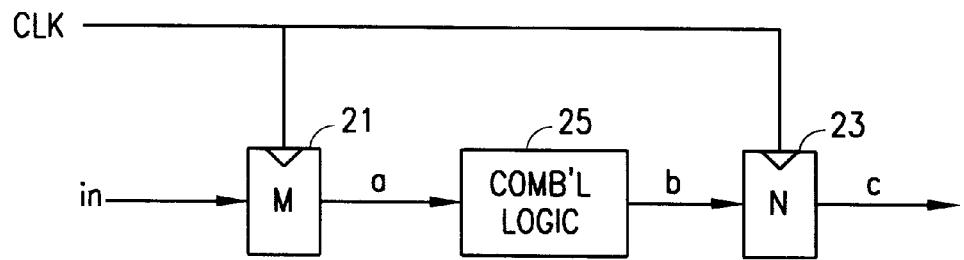
FIG. 2 illustrates an exemplary portion of FIG. 1 in more detail.

FIG. 2 shows an example of one pipeline stage in a synchronous digital circuit such as illustrated in FIG. 1. In FIG. 2, the flip-flops M and N at 21 and 23 are exemplary of the storage elements at 11 and 13, respectively, in FIG. 1. A timing diagram for the FIG. 2 example is shown in FIG. 3.

The delay DL through the combinational logic 25 can take a range of values depending on the function performed by the combinational logic. The setup time S and the hold time H of the flip flop 23 are data-dependent but can be considered constant for this discussion. The internal (clock-to-output) delays of the flip-flops 21 and 23, DN and DM respectively, are best considered as two values of a single parameter DI, as will become evident below. In FIG. 3, T is the clock period of the clock signal CLK of FIGS. 1 and 2, IN and IM are the respective current draws of flip-flops 23 and 21, and a, b and c represent signal activities at the correspondingly designated nodes in FIG. 2. As shown in FIG. 3, the different delay values DM and DN result in an offset between the switching currents IN and IM (see broken lines in FIG. 3) produced by flip-flops 21 and 23 in response to the leftmost transition in CLK.

Figure 3:
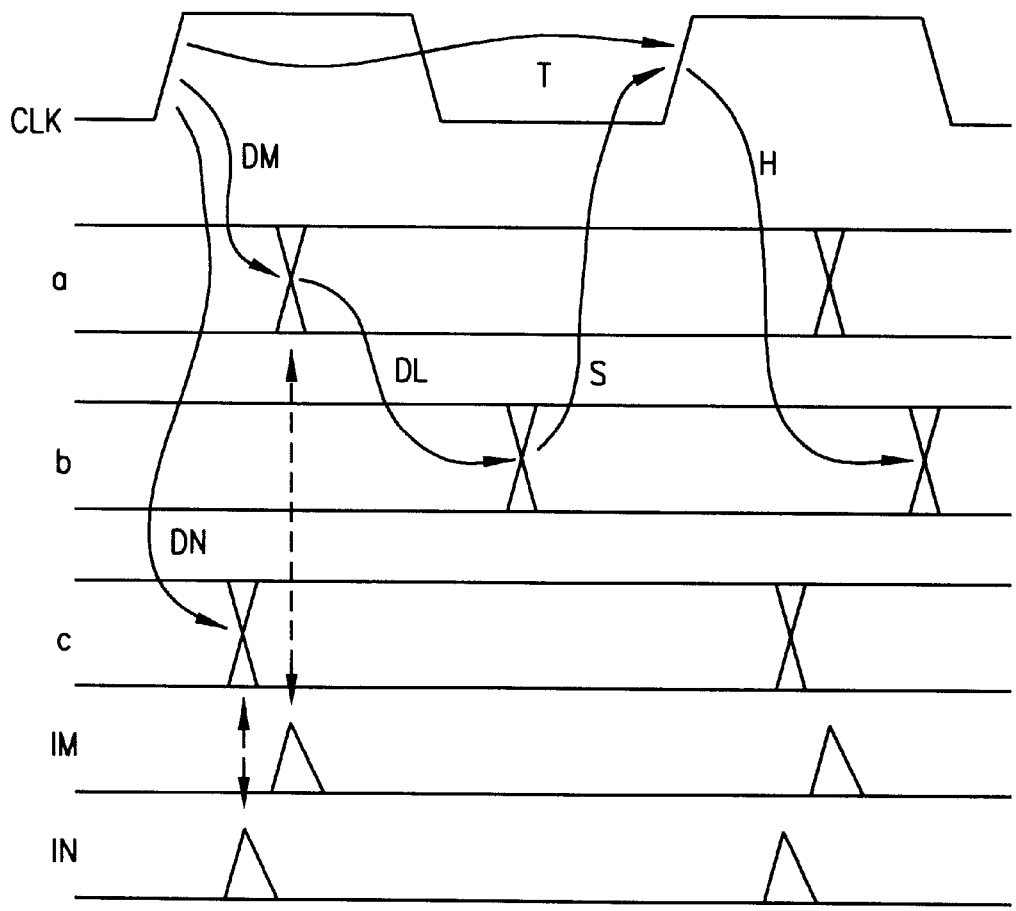
FIG. 3 is a timing diagram associated with the example of FIG. 2.

In the FIG. 3 example, the pulses in currents IM and IN exhibit a substantially non-overlapping timewise relationship relative to one another, and are generally the same size and shape. However, neither of these relationships is necessary. Beneficial current smearing can be achieved with current pulses of respectively different sizes and shapes, and even if some or all of the current pulses timewise overlap one another to some extent.

It is required for all signal paths through the logic 25 between the two flip-flops that T>DI+DL+S. Failure to meet this requirement causes a setup violation. It is also required that DI+DL>H. Failure to meet this requirement causes a hold violation. The foregoing two relations can be combined to yield an expression for the upper limit on the possible flip-flop delay spread (assuming full knowledge of the DL distribution when delays are assigned to storage elements):

$$T>\max(DI)+\min(DL)+S \quad (1)$$

$$\min(DI)+\max(DL)>H \quad (2)$$

$$\mathrm{range}(DI)<T-S-H+\mathrm{range}(DL) \quad (3)$$

were, range(X)=max(X)−min(X), and T, S and H are known. A large range of logic delays, that is, a large value of range (DL), apparently gives more opportunity for storage element delay spread, that is, permits a larger value of range(DI).

The upper limit on the safe delay spread (assuming no knowledge of the distribution of DL during delay assignment, except for the minimum and maximum values) is given by the following expressions:

$$T>\max(DI)+\max(DL)+S \quad (4)$$

$$\min(DI)+\min(DL)>H \quad (5)$$

$$\mathrm{range}(DI)<T-S-H-\mathrm{range}(DL) \quad (6)$$

Wide variation of DI (large value of range(DI)) without knowledge of the distribution of DL requires that the clock period T be large compared to max(DL) and S, which will allow max(DI) (and hence range(DI)) to grow large according to Equation 4.

In one embodiment, the digital circuit of FIG. 1 is provided in an integrated circuit, and the storage elements are provided as respective cells of the integrated circuit. Provided that the cell outlines of the storage elements are similar, assignment of delay values to storage elements can be carried out quite late in the design cycle of an integrated circuit, viz., after the place-and-route stage. The capacitances driven by each storage element (including the routing capacitances) are reasonably well known at that stage, so the delay value assignment process has more information at its disposal.

The selection of the best delay value benefits greatly from having precise values for the load capacitance that each storage element is to drive. Storage elements which will drive a large capacitance will contribute large current pulses, which are more significant than pulses related to smaller loads in the summation which results in the overall current pulse. The load values cannot be extracted until the detailed placement and routing of the design have been completed. If the cell outlines of the storage elements (e.g., the cell outlines of storage elements M and N of FIG. 2) are identical or substantially identical, then swapping one storage element for another with a different delay value does not alter the placement or routing of the design. The load capacitance should therefore also remain substantially the same after the substitution.

Significantly different outlines of the storage element cells could either: (1) force the storage element cell selection to be done before detailed place-and-route and thus with less information available, to the detriment of the quality of the result; or (2) necessitate adjustments to the placement and routing after storage element cell substitution, which might change the load capacitances upon which the substitution was based and possibly even force iteration of the substitution procedure.

Figure 7:
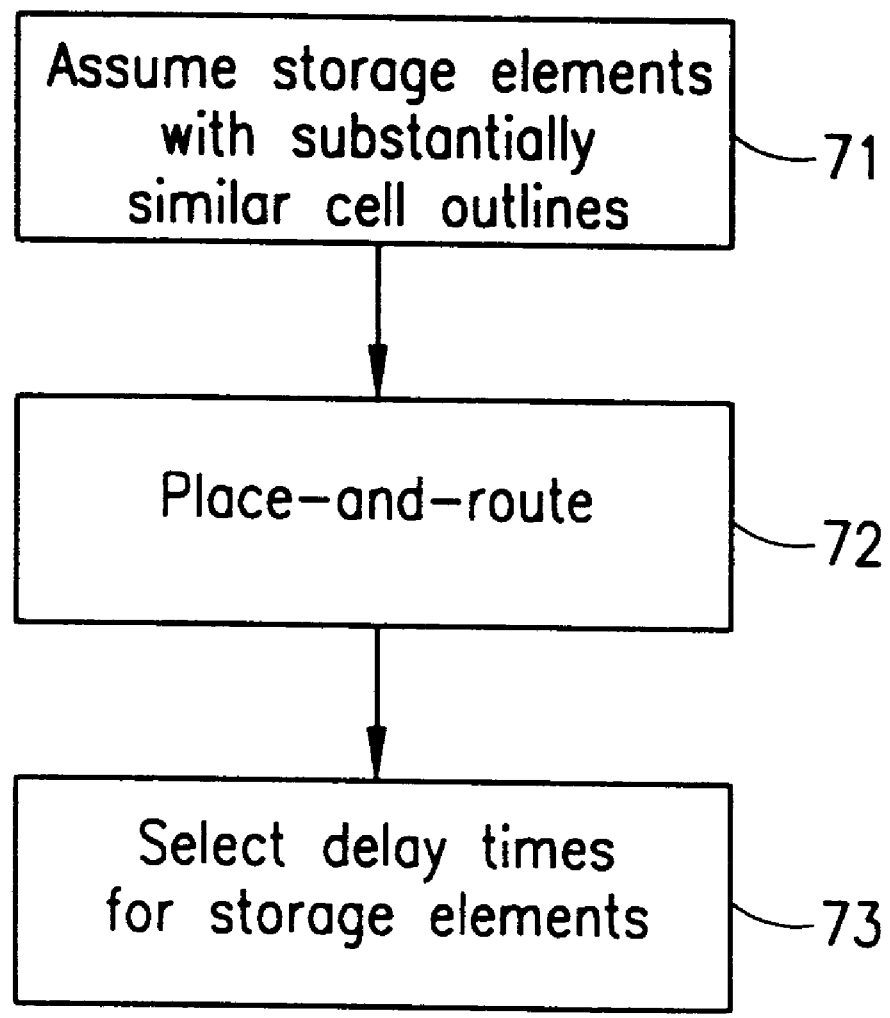
FIG. 7 illustrates a specific example of the process of FIG. 6.

FIG. 7 illustrates an example of the process described above, wherein substantially similar cell outlines are assumed at 71, place-and-route operations are performed at 72 based on the assumption at 71, and thereafter the storage element delay times are selected at 73.

Embodiments wherein the storage element variants have similar or identical cell outlines can be expected to require a cost in the average circuit area, because all storage element variants, regardless of their respective delay times, would have to be generally as large as the largest one.

Benefits could also be drawn from assigning the delay values in conjunction with the clock network synthesis. First, it may be possible to reduce the requirements on the clock distribution network by suitable assignment of the storage element delays. Typically, clock distribution networks are constructed to ensure that the clock transitions arrive at all storage element clock inputs simultaneously. This requirement is frequently hard to fulfill and increases the cost of the clock distribution network significantly.

With reference to FIG. 2, an imperfectly balanced clock distribution network would cause the clock signal to arrive at slightly different times at storage elements M and N. Depending on the sign of the difference, such clock skew would make either the setup time or the hold time requirement of storage element N more difficult to fulfill. If the clock signal arrives at M later than at N, the setup time requirement is affected, whereas the hold time requirement is affected in the other case.

Figure 5:
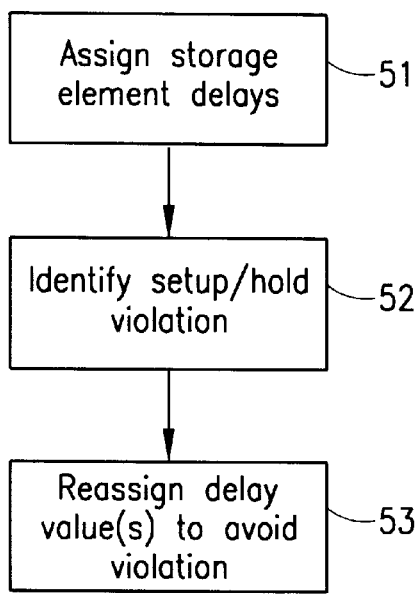
FIG. 5 illustrates an example of how setup and hold violations in a digital circuit can be avoided according to the invention.

Availability of several storage elements with different DI values could be used to mitigate the effects of clock skew. For example, a hold violation caused by early clock transition arrival at storage element M could be compensated for by substituting a different storage element with a slightly longer delay than would be necessary in the absence of clock skew. This is shown generally in FIG. 5. In this example, the violation at 52 is assumed to be caused by clock skew. For example, if the extra delay of the substituted storage element were of the same magnitude as the clock skew, the requirements on DL to ensure the hold condition would be identical to the skew-free case.

Figure 4:
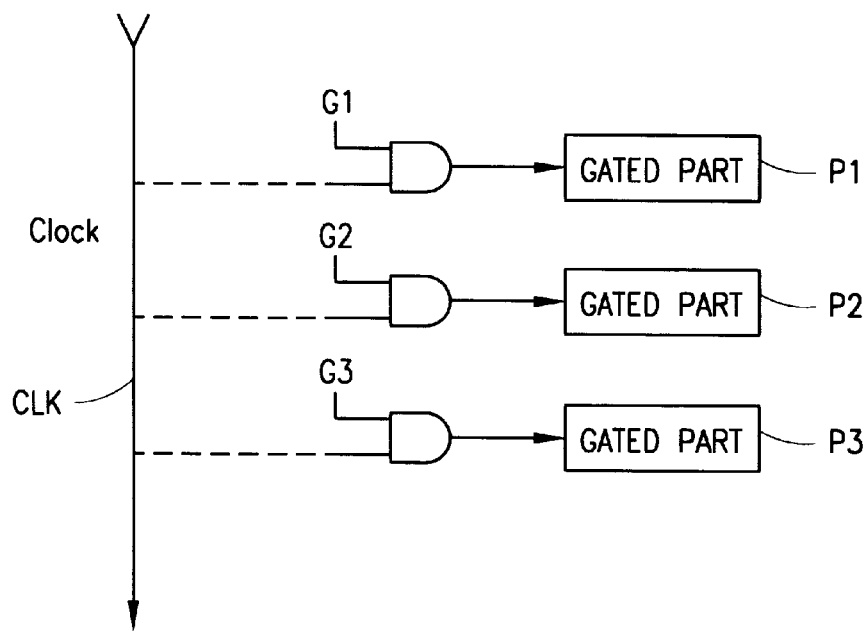
FIG. 4 illustrates application of the present invention to gated parts of a digital circuit.

Referencing exemplary FIG. 4, when clock gating as shown at G1–G3 is used to disable parts P1–P3 (each part P1–P3 can be a digital circuit as shown generally in FIG. 1) of an overall digital circuit, for example an integrated circuit, it may be beneficial to assign storage element delay times in such a way that each of gated parts P1–P3 contributes a suitably smeared current spike to the overall supply draw of the overall circuit. This approach could be used to assure a smeared aggregate current spike no matter how many (or how few) parts of the overall circuit may be disabled. As shown by broken lines in FIG. 4, the gated parts can be clocked by their own respective clock signals, or by a common clock signal.

Although it is not necessary to take the clock distribution network into account during delay time selection, it has the potential to give better overall results, as in the examples described above.

Although some of the above-described exemplary embodiments show single-phase clocking with flip-flops and latches as storage elements, the invention can also be used with other clocking schemes and other storage elements.

Storage elements with differing delay values can also be used to alleviate timing problems in general. The storage element setup and hold conditions are affected by the selection of storage element delays, as shown above. Thus, storage element delay values can be chosen explicitly to affect the setup and hold conditions. Because this can be done after the place-and-route stage, costly synthesis iterations can be avoided. For example, if a setup or hold time violation is identified after place-and-route operations at 72 and selection of delay times at 73 (see FIG. 7), and whether or not the violation is caused by clock skew as described above, it may be possible to avoid the problem by simply re-assigning one or more delay values among the storage elements. This can be done so as not to affect the desired current smearing, but still solve the setup/hold problem. This is illustrated at 51–53 in FIG. 5.

Delay value re-assignment as discussed above can be accomplished, for example, by swapping among storage elements already selected for and placed in the design, by replacing one or more already-selected storage elements with further storage elements not presently in the design, or by a combination of swapping and replacing.

As described in detail above, the invention provides, among others, the following exemplary advantageous features.

The use of several variants of each storage element type, where the variants differ only in the amount of delay from the clock input to the data output(s), for the purpose of mitigating supply current peaks.

The assignment of storage element delays can occur after cell placement and signal routing, when capacitive loads driven by each storage element are known more accurately than before.

The storage element delay assignment can be done in combination with clock tree generation, such that no more effort than necessary need be spent on providing balanced clocks.

The storage element delay assignment can be done in combination with clock gating, such that the supply current of any design sub-block controlled by a certain clock-gating predicate is individually smeared out.

Although exemplary embodiments of the present invention have been described above in detail, this does not limit the scope of the invention, which can be practiced in a variety of embodiments.

What is claimed is:

1. A digital circuit, comprising:

combinational logic for performing logic operations;

a plurality of storage elements, each said storage element having a digital data input, a digital data output and a clock input, each said storage element responsive to a transition of a clock signal at said clock input thereof to transfer a digital signal from said data input thereof to said data output thereof, wherein a time delay occurs between said clock signal transition and completion of said transfer of said digital signal from said data input to said data output;

said clock inputs of said storage elements coupled together to permit clocking said storage elements with a common clock signal;

each of said storage elements having one of said data input and said data output thereof coupled to said combinational logic; and said time delays of some said storage elements differing from said time delays of other said storage elements for timewise offsetting supply currents associated with completion of said digital signal transfers in said some storage elements from supply currents associated with completion of said digital signal transfers in said other storage elements.

2. The digital circuit of claim 1, wherein the digital circuit is provided in an integrated circuit.

3. The digital circuit of claim 2, wherein said storage elements are provided as respective cells of said integrated circuit, said cells having substantially identical cell outlines.

4. The digital circuit of claim 1, wherein said clock signal is a single phase clock signal.

5. The digital circuit of claim 1, wherein one of said storage elements is a latch.

6. The digital circuit of claim 1, wherein one of said storage elements is a flip-flop.

7. The digital circuit of claim 1, wherein said time delay of each said storage element differs from said time delay of every other said storage element.

8. The digital circuit of claim 1, wherein a supply current pulse associated with completion of said digital signal transfer in one said storage element and a supply current pulse associated with completion of said digital signal transfer in another said storage element occur in a substantially non-overlapping timewise relationship relative to one another.

9. A method of designing a digital circuit, comprising:

providing combinational logic for performing logic operations;

providing a plurality of storage elements that are each responsive to a transition of a clock signal at a clock input thereof to transfer a digital signal from a data input thereof to a data output thereof, and wherein a time delay occurs between said clock signal transition and completion of said transfer of said digital signal from said data input to said data output;

coupling said clock inputs of said storage elements together to permit clocking said storage elements with a common clock signal;

coupling one of said data input and said data output of each storage element to said combinational logic; and providing some said storage elements with time delays that differ from said time delays of other said storage elements for timewise offsetting supply currents associated with completion of said digital signal transfers in said some storage elements from supply currents associated with completion of said digital signal transfers in said other storage elements.

10. The method of claim 9, including determining a plurality of loads to be driven respectively by the plurality of storage elements, said step of providing time delays including assigning the respective time delays after said step of determining the loads to be driven by the respective storage elements.

11. The method of claim 9, wherein said step of providing a plurality of storage elements includes providing the storage elements in an integrated circuit.

12. The method of claim 11, wherein said step of providing a plurality of storage elements includes providing a group of storage elements as respective cells for use in the integrated circuit and having substantially similar cell outlines, said last-mentioned coupling step including performing cell placement and signal routing relative to the cells of the group, and said step of providing a plurality of storage elements including, after said performing step replacing one of the cells of the group with another cell having a substantially similar cell outline.

13. The method of claim 12, wherein said replacing step includes replacing the one cell with another cell of the group.

14. The method of claim 12, wherein said replacing step includes replacing the one cell with a cell other than from the group.

15. The method of claim 9, including:

providing further combinational logic for performing logic operations;

providing a further plurality of storage elements that are each responsive to a transition of a clock signal at a clock input thereof to transfer a digital signal from a data input thereof to a data output thereof, and wherein a time delay occurs between said clock signal transition and completion of said transfer of said digital signal from said data input to said data output;

coupling said clock inputs of said further storage elements together to permit clocking said further storage elements with a common clock signal;

coupling one of said data input and said data output of each said further storage element to said further combinational logic;

providing some of said further storage elements with time delays that differ from said time delays of other said further storage elements for timewise offsetting supply currents associated with completion of said digital signal transfers in said some further storage elements from supply currents associated with completion of said digital signal transfers in said other further storage elements; and providing a gating signal path for use in selectively gating off the common clock signal associated with one of the pluralities of storage elements.

16. The method of claim 9, including identifying, with respect to one of the storage elements, one of a setup violation and a hold violation, and assigning, in response to identification of the violation, at least one of the time delays such that the identified violation is avoided.

17. The method of claim 16, wherein said assigning step includes swapping one of said plurality of storage elements with another of said plurality of storage elements having a different time delay than said one storage element.

18. The method of claim 16, wherein said identifying step includes identifying that the violation is caused by a clock skew condition.

19. The method of claim 9, wherein said step of providing a plurality of storage elements includes providing a latch.

20. The method of claim 9, wherein said step of providing a plurality of storage elements includes providing a flip-flop.

* * * * *

UNITED STATES PATENT AND TRADEMARK OFFICE
CERTIFICATE OF CORRECTION

PATENT NO.     : 6,262,612 B1
DATED          : July 17, 2001
INVENTOR(S)    : Svensson et al.

It is certified that error appears in the above-identified patent and that said Letters Patent is hereby corrected as shown below:

<u>Title page,</u>
Item [75], replace "Bjarred" with -- Bjärred --

<u>Column 3,</u>
Line 66, replace "were" with -- where --

Signed and Sealed this

Thirtieth Day of April, 2002

Attest:

JAMES E. ROGAN
*Attesting Officer*     *Director of the United States Patent and Trademark Office*